United States Patent
Liepold et al.

(10) Patent No.: US 9,360,189 B2
(45) Date of Patent: Jun. 7, 2016

(54) CERAMIC CONVERSION ELEMENT, OPTOELECTRONIC COMPONENT COMPRISING A CERAMIC CONVERSION ELEMENT, AND METHODS FOR PRODUCING A CERAMIC CONVERSION ELEMENT

(75) Inventors: Ute Liepold, München (DE); Carsten Schuh, Baldham (DE); Gia Khanh Pham, Charlotte, NC (US); Mikael Ahlstedt, München (DE)

(73) Assignee: OSRAM Opto Semiconductors GmbH (DE)

( * ) Notice: Subject to any disclaimer, the term of this patent is extended or adjusted under 35 U.S.C. 154(b) by 314 days.

(21) Appl. No.: 14/350,595

(22) PCT Filed: Sep. 10, 2012

(86) PCT No.: PCT/EP2012/067663
§ 371 (c)(1),
(2), (4) Date: Jun. 10, 2014

(87) PCT Pub. No.: WO2013/056895
PCT Pub. Date: Apr. 25, 2013

(65) Prior Publication Data
US 2014/0319572 A1    Oct. 30, 2014

(30) Foreign Application Priority Data

Oct. 17, 2011   (DE) .......................... 10 2011 116 229

(51) Int. Cl.
*F21V 9/16*     (2006.01)
*H01L 33/50*    (2010.01)

(52) U.S. Cl.
CPC ................ *F21V 9/16* (2013.01); *H01L 33/504* (2013.01); *H01L 33/501* (2013.01); *H01L 2933/0041* (2013.01)

(58) Field of Classification Search
CPC . F21V 9/16; H01L 33/504; H01L 2933/0041; H01L 33/501
See application file for complete search history.

(56) References Cited

U.S. PATENT DOCUMENTS

| | | | |
|---|---|---|---|
| 6,329,676 B1 * | 12/2001 | Takayama | H01L 27/153 257/88 |
| 7,858,408 B2 | 12/2010 | Mueller et al. | |
| 2010/0038665 A1 | 2/2010 | Sugiura et al. | |
| 2011/0025951 A1 | 2/2011 | Jones | |

FOREIGN PATENT DOCUMENTS

| | | |
|---|---|---|
| DE | 10 2010 050 832 | 5/2012 |
| FR | 2 949 117 | 2/2011 |
| JP | 2009-140975 | 6/2009 |
| WO | 2006/072849 | 7/2006 |
| WO | 2010/134331 | 11/2010 |
| WO | 2011/079900 | 7/2011 |
| WO | 2011/092646 | 8/2011 |

* cited by examiner

*Primary Examiner* — David V Bruce
(74) *Attorney, Agent, or Firm* — DLA Piper LLP (US)

(57) ABSTRACT

A ceramic conversion element includes a multiplicity of first regions and a multiplicity of second regions, wherein the first regions vitreous, ceramic or monocrystalline fashion, at least either the first regions or the second regions are columnar and have a preferred direction forming an angle of at most 45° with a normal to a main surface of the conversion element, the first regions convert electromagnetic radiation in a first wavelength range into electromagnetic radiation in a second wavelength range different from the first wavelength range, the second regions convert electromagnetic radiation in the first wavelength range into electromagnetic radiation in a third wavelength range different from the first and second wavelength ranges, wherein the second regions are formed by a resin into which phosphor particles are embedded.

13 Claims, 10 Drawing Sheets

CERAMIC CONVERSION ELEMENT, OPTOELECTRONIC COMPONENT COMPRISING A CERAMIC CONVERSION ELEMENT, AND METHODS FOR PRODUCING A CERAMIC CONVERSION ELEMENT

TECHNICAL FIELD

This disclosure relates to a ceramic conversion element, an optoelectronic component comprising a ceramic conversion element and several methods of producing a ceramic conversion element.

BACKGROUND

U.S. Pat. No. 7,858,408 discloses a conversion element that converts primary blue radiation both partly into yellow light and into red light. It is possible with such a conversion element to generate mixed light having a color locus in the warm-white region of the CIE standard chromaticity diagram from blue radiation of a semiconductor body. The conversion element in accordance with U.S. Pat. No. 7,858,408 is formed from a ceramic YAG:Ce plate and a resin layer with wavelength-converting phosphor particles, which is arranged above the ceramic wavelength-converting plate. This arrangement has the disadvantage that heat can be dissipated comparatively poorly in particular from the resin layer.

It could therefore be helpful to provide a conversion element that converts primary electromagnetic radiation into two different wavelength ranges, for example, to generate warm-white mixed light. In particular, it could be helpful to improve the dissipation of heat from the conversion element during operation.

Furthermore, it could be helpful to provide an optoelectronic component comprising such a ceramic conversion element and also a method of producing such a conversion element.

SUMMARY

We provide a ceramic conversion element including a multiplicity of first regions and a multiplicity of second regions, wherein the first regions are vitreous, ceramic or monocrystalline, at least either the first regions or the second regions are columnar and have a preferred direction forming an angle of at most 45° with a normal to a main surface of the conversion element, the first regions convert electromagnetic radiation in a first wavelength range into electromagnetic radiation in a second wavelength range different from the first wavelength range, the second regions are suitable for converting electromagnetic radiation in the first wavelength range into electromagnetic radiation in a third wavelength range, which is different than the first and second wavelength ranges, wherein the second regions are formed by a resin into which phosphor particles are embedded.

We also provide an optoelectronic component including a semiconductor body, which emits electromagnetic radiation in a first wavelength range from its radiation exit surface during operation, and a ceramic conversion element according to claim 1, which converts at least part of the radiation in the first wavelength range emitted by the semiconductor body into radiation in a second wavelength range different from the first wavelength range, and into a third wavelength range different from the first and second wavelength ranges.

We further provide a method of producing a ceramic conversion element including providing a bundle of ceramic or monocrystalline fibers that convert electromagnetic radiation in a first wavelength range into electromagnetic radiation in a second wavelength range different from the first wavelength range, introducing a resin with phosphor particles between the fibers of the fiber bundle, wherein the phosphor particles convert electromagnetic radiation in the first wavelength range into electromagnetic radiation in a third wavelength range different from the first and second wavelength ranges, curing the composite comprising fiber bundle and resin such that the fibers form a multiplicity of first regions and the resin forms a multiplicity of second regions.

Still further, we provide a method of producing a ceramic conversion element including: providing ceramic or monocrystalline fibers that convert electromagnetic radiation in a first wavelength range into electromagnetic radiation in a second wavelength range different from the first wavelength range, coating the fibers with a resin into which phosphor particles are introduced, wherein the phosphor particles convert electromagnetic radiation in the first wavelength range into electromagnetic radiation in a third wavelength range, different from the first and second wavelength ranges, bundling the coated fibers to form a fiber bundle, and curing the bundle comprising coated fibers, such that the fibers form a multiplicity of first regions and the resin forms a multiplicity of second regions.

Yet further, we provide a method of producing a ceramic conversion element including: providing a ceramic or vitreous plate comprising a multiplicity of air-filled second regions, wherein the material of the plate converts electromagnetic radiation in a first wavelength range into electromagnetic radiation in a second wavelength range different from the first wavelength range, said plate is produced by a method including the following steps: providing ceramic or monocrystalline fibers that converts electromagnetic radiation in a first wavelength range into radiation in a second wavelength range different than the first wavelength range, processing the fibers to form a slip, drawing the slip into a green sheet, wherein the fibers are oriented in a preferred direction parallel to a main surface of the green sheet along the drawing direction, processing the green sheet further to form a ceramic or vitreous plate, introducing a resin into which phosphor particles are introduced, said phosphor converting radiation in the first wavelength range into radiation in a third wavelength range different from the first and second wavelength ranges, into air-filled second regions of the plate, and curing the resin.

DETAILED DESCRIPTION

Figure 1:
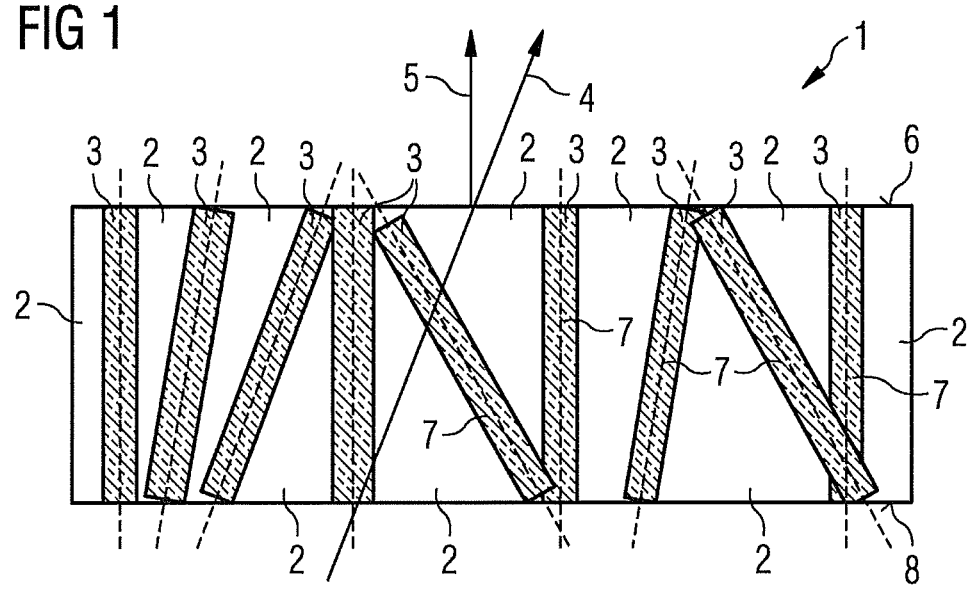
FIGS. 1 and 2 show a schematic sectional illustration of a ceramic conversion element in accordance with a respective example.

Our ceramic conversion elements particularly preferably comprise a multiplicity of first regions and a multiplicity of second regions, wherein the first regions are vitreous, preferably ceramic or monocrystalline. In particular ceramic or monocrystalline first regions are particularly suitable to dissipate heat from the conversion element.

Furthermore, at least either the first or the second regions are preferably columnar. In this case, the columnar regions form a cylinder at least in sections. By way of example, the columnar regions are composed of a plurality of cylindrical sections, the rotation axes of which are in each case arranged in a manner offset with respect to one another. In particular, it is preferably possible to assign an envelope in the form of a cylinder to a columnar region. Particularly preferably, a respective envelope can be assigned to at least two different columnar regions, the envelopes not overlapping.

The columnar regions preferably have a preferred direction forming an angle of at most 45° normal to a main surface of the conversion element. This means that the rotation axes of the cylindrical envelopes of the columnar regions on average form an angle of at most 45° with the normal to the main surface of the conversion element.

Particularly preferably, the preferred direction forms on average an angle of at most 30°, particularly preferably at most 20°, with the normal to the main surface of the conversion element.

Particularly preferably, the first regions and/or the second regions penetrate through the conversion element predominantly completely. Particularly preferably, the first regions and the second regions penetrate through the conversion element predominantly completely.

It should explicitly be pointed out at this juncture that it is possible that either only the first regions are columnar and preferably have a corresponding preferred direction or only the second regions are columnar and have a corresponding preferred direction. It is also possible that the first and the second regions are columnar and have a corresponding preferred direction. If the first and the second types of regions are columnar, then they can, in particular, also be arranged alternately.

By way of example, it is also possible that the first or the second regions are columnar and embedded in a matrix, wherein the surrounding matrix forms the other type of regions.

Furthermore, the first regions are preferably wavelength-converting. The first regions then preferably convert electromagnetic radiation in a first wavelength range into electromagnetic radiation in a second wavelength range-different from the first wavelength range. By way of example, the first regions are formed from wavelength-converting monocrystalline or ceramic fibers.

Furthermore, the second regions are also preferably wavelength-converting. The second regions then convert electromagnetic radiation in the first wavelength range into electromagnetic radiation in a third wavelength range different from the first and second wavelength ranges.

It should be pointed out that although the first wavelength range, the second wavelength range and/or the third wavelength range are different from one another, this does not preclude the wavelength ranges from partly overlapping.

The first regions and/or the second regions are preferably columnar and have a preferred direction forming an angle of at most 45° to normal to a main surface of the conversion element. In this way, a conversion element is provided in which heat can be dissipated particularly well from the first regions and the second regions. In particular, the heat is dissipated particularly well via first columnar regions having the preferred direction described, which regions are ceramic or monocrystalline.

Particularly preferably, the second regions are formed by a resin into which phosphor particles are embedded. In this case, the phosphor particles convert electromagnetic radiation in the first wavelength range into electromagnetic radiation in the third wavelength range.

The resin used can be, for example, a silicone resin, an epoxy resin, an acrylate resin or a mixture of at least two of these materials.

The wavelength-converting first regions and/or the wavelength-converting phosphor particles can, for example, be formed by one of the following materials or comprise one of the following materials: garnets doped with rare earth metals, alkaline earth metal sulfides doped with rare earth metals, thiogallates doped with rare earth metals, aluminates doped with rare earth metals, silicates doped with rare earth metals, orthosilicates doped with rare earth metals, chlorosilicates doped with rare earth metals, alkaline earth metal silicon nitrides doped with rare earth metals, oxynitrides doped with rare earth metals and aluminum oxynitrides doped with rare earth metals, silicon nitrides doped with rare earth metals, sialons doped with rare earth metals.

The conversion element may have a carrier on which the first regions and the second regions are arranged. In this case, the main surface of the carrier is arranged particularly preferably parallel to the main surface of the conversion element. The carrier can furthermore itself also be wavelength-converting.

Particularly preferably, the carrier is a ceramic or monocrystalline carrier plate. By way of example, aluminum oxide or YAG is suitable as a ceramic material for the carrier plate. If the carrier plate itself is intended likewise to be wavelength-converting, then YAG:Ce, for example, is suitable as a ceramic or monocrystalline material. By way of example, sapphire or monocrystalline YAG or YAG:Ce is suitable as monocrystalline material. With the aid of a ceramic or monocrystalline carrier plate, on which the first and the second regions are applied, dissipation of heat from the conversion element during operation can advantageously be improved further.

The carrier plate preferably has a thickness of 30 μm to 500 μm. Particularly preferably, the thickness of the carrier plate is 50 μm to 300 μm.

Furthermore, the carrier plate can also comprise one of the following materials or be formed from one of the following materials: glass, polymer.

A carrier plate is preferably used in a conversion element whose first regions are formed by wavelength-converting monocrystalline or ceramic fibers. In this case, the carrier plate is preferably likewise ceramic or monocrystalline. The fibers which forme the first regions are preferably sintered onto the carrier plate.

The ceramic conversion element is provided, in particular, for being used in conjunction with a semiconductor body that emits electromagnetic radiation in a first wavelength range from its radiation exit surface during operation. The ceramic conversion element converts at least part of the radiation in the first wavelength range emitted by the semiconductor body into radiation in a second wavelength range different from the first wavelength range, and into radiation in a third wavelength range different from the first and second wavelength ranges.

Particularly preferably, the ceramic conversion element is applied with a main surface in direct contact onto the radiation exit surface of the semiconductor body. As a result, during operation of the optoelectronic semiconductor component, in particular it is possible to obtain better dissipation of heat from the conversion element. It should be pointed out at this juncture that the expression "that the conversion element is applied in direct contact onto the radiation exit surface of the semiconductor body" is also understood to mean that the conversion element is fixed on the radiation exit surface of the semiconductor body by a joining layer.

If the ceramic conversion element comprises a carrier on which the first and the second regions are arranged, then the ceramic conversion element is preferably arranged above the semiconductor body such that the carrier faces the radiation exit surface of the semiconductor body. This is the case, in particular, if the carrier comprises a material having a good thermal conductivity such as a ceramic material or a monocrystalline material, for example.

Particularly if the carrier comprises a material having a comparatively low thermal conductivity such as a glass or a polymer, for example, then the conversion element is preferably arranged above the semiconductor body such that the carrier faces away from the radiation exit surface.

Preferably, the semiconductor body emits electromagnetic radiation comprising radiation from the ultraviolet, blue and/or green spectral range. Particularly preferably, the semiconductor body emits blue light.

Particularly preferably, the first wavelength range comprises blue light, the second wavelength range comprises yellow light and the third wavelength range comprises red light. Particularly preferably, the conversion element is suitable for converting only part of the blue light into yellow light and another part of the blue light into red light, with the result that the ceramic conversion element forms, from primary blue radiation, warm-white light having radiation components from the blue spectral range, from the yellow spectral range and from the red spectral range.

Particularly preferably, the first regions convert blue light into yellow light. For this purpose, the first regions preferably contain YAG:Ce or are formed from this material.

The second regions particularly preferably convert blue light into red light. For this purpose, the second regions preferably contain a nitride material such as, for example, $Me_2Si_5N_8$:Eu or $MeSiAlN_3$:Eu, where Me stands for one or a plurality of alkaline earth metals, or are formed from a nitride material. Particularly preferably, the second regions are formed from a resin into which phosphor particles are embedded, wherein the phosphor particles comprise a nitride material or are formed from a nitride material.

If the semiconductor body emits ultraviolet light, then the ultraviolet light of the semiconductor body is converted into visible light preferably as completely as possible by the ceramic conversion element, to obtain a particularly high efficiency of the semiconductor component. Particularly preferably, in this case, part of the ultraviolet radiation emitted by the semiconductor body is converted into yellow light, another part of the ultraviolet radiation of the semiconductor body is converted into blue light, and in turn another part of the ultraviolet radiation is converted into red light, with the result that the semiconductor component emits warm-white light. In this example of the optoelectronic component, the first regions can convert ultraviolet radiation into yellow light and the second regions are formed by a resin into which two different types of phosphor particles are embedded. The first phosphor particles convert the ultraviolet light into blue light, for example, while the second type of phosphor particles convert the ultraviolet light into red radiation.

To produce the ceramic conversion element, preferably a bundle of ceramic or monocrystalline fibers is provided, the fibers convert electromagnetic radiation in a first wavelength range into electromagnetic radiation in a second wavelength range different from the first wavelength range. Particularly preferably, a densely pressed and/or densely ordered long fiber bundle is used in this case. Long fibers preferably have a length of several centimeters. In general, long fibers can advantageously be oriented particularly well along a preferred direction.

In a next step, a resin with phosphor particles is introduced between fibers of the fiber bundle, for example, by impregnation. In this case, the phosphor particles convert electromagnetic radiation in the first wavelength range into electromagnetic radiation in a third wavelength range different from the first and second wavelength ranges. In this case, the resin with the phosphor particles can furthermore contain a solvent to reduce the viscosity of the resin. In this way, the resin can be introduced into the fiber bundle more easily. The use of a solvent can generally be dispensed with if the viscosity of the resin itself is already comparatively low. A resin having a comparatively low viscosity is generally an acrylate resin or a silicone resin, for example.

In a next step, the composite comprising fiber bundle and resin is cured, for example, by the resin being crosslinked such that the fibers form a multiplicity of first regions and the resin forms a multiplicity of second regions. Curing the composite comprising fiber bundle and resin can be effected, for example, by application of elevated temperature.

In this method, the resin can be introduced between the fibers of the bundle by vacuum or excess pressure, for example. Particularly preferably, the resin is introduced between the fibers of the bundle by impregnation under vacuum or excess pressure.

The ceramic conversion element can furthermore, for example, also be produced by a method as described below.

Ceramic or monocrystalline fibers are provided which convert electromagnetic radiation in a first wavelength range into electromagnetic radiation in a second wavelength range different from the first wavelength range. In this case, in contrast to the method described above, the fibers are not yet present as a bundle. In this case, by way of example, short or long fibers can be used. In contrast to long fibers, which preferably have a length of several centimeters, short fibers preferably have a length of a few millimeters. The fibers preferably have a diameter which does not exceed 100 μm.

In a next step, the fibers are coated with a resin into which phosphor particles are introduced, wherein the phosphor particles convert electromagnetic radiation in the first wavelength range into electromagnetic radiation in a third wavelength range different from the first and second wavelength ranges. The fibers can be coated with the resin, for example, by being drawn through the resin.

The coated fibers are subsequently bundled.

Finally, the bundle comprising coated fibers is cured such that the fibers form a multiplicity of first regions and the resin forms a multiplicity of second regions.

Curing the fiber bundle can be effected under pressure and vacuum, for example, to advantageously increase the packing density of the fibers and to avoid air inclusions in the conversion element.

Preferably, the resin is partly cured before the process of bundling the fibers. Furthermore, a step of drying the fibers can also be carried out before the partial curing and/or before the process of bundling the fibers.

The conversion element can furthermore also be produced by the method described below.

A ceramic or vitreous plate having a multiplicity of air-filled second regions is provided, wherein the material of the plate converts electromagnetic radiation in a first wavelength range into radiation in a second wavelength range different from the first wavelength range. The material of the plate forms the first regions in the finished conversion element.

In a further step, a resin into which phosphor particles are introduced, the phosphor particles converting radiation in the first wavelength range into radiation in a third wavelength range different from the first and second wavelength ranges, is introduced into the air-filled second regions of the plate.

The resin is subsequently cured, for example, thermally by application of heat or else by ultraviolet radiation.

The plate can be produced, for example, by a method as described below.

Ceramic or monocrystalline fibers are provided to convert electromagnetic radiation in a first wavelength range into radiation in a second wavelength range different from the first wavelength range. The fibers are processed to form a slip. The slip is then drawn into a green sheet, wherein the fibers are oriented in a preferred direction parallel to a main surface of the green sheet along the drawing direction. A slotted nozzle is preferably used during the process of drawing into a slip. In this case, the opening of the slotted nozzle preferably has a dimensioning of at 150 µm, particularly preferably at least 500 µm. The use of a slotted nozzle preferably contributes to the orientation of the fibers. The green sheet is then processed further to form a ceramic or vitreous plate. The further processing of the green sheet to form a plate can be effected, for example, by a method as described in DE 10 2010 050 832, the contents of which are hereby incorporated by reference. Particularly preferably, in our methods, individual green sheets are laminated to form a green plate before they are processed further as specified to obtain a certain thickness of the plate.

Particularly preferably, during the process of drawing the slip into the green sheet, the fibers are oriented parallel to the main surface of the green sheet in the direction of the preferred direction by the application of a magnetic field. The magnetic field particularly preferably has a field strength of at least 5 teslas. With the aid of the magnetic field, it is advantageously possible to orient the fibers to a greater extent in the direction of the preferred direction.

Particularly preferably, ceramic or monocrystalline short fibers are used in this method. The short fibers particularly preferably have an average length such that very deep cavities arise in the fiber plate that forms. Particularly preferably, the fibers for this purpose have a length which corresponds at least to the thickness of the later conversion element.

The ceramic or monocrystalline fibers may be applied to a carrier, for example, by sintering. In this case, the sintering is expediently effected before the plate is filled with the resin.

The thickness of the conversion element is preferably 50 µm to 500 µm.

The ceramic or vitreous plate can alternatively also be produced by the method described below.

A basic material for the ceramic or vitreous plate is provided. In this case, the basic material converts radiation in a first wavelength range into radiation in a second wavelength range different from the first wavelength range. Organic fibers and/or laminae are introduced into the basic material, with the result that a slip arises. The slip is drawn into a green sheet, wherein the fibers and/or the laminae are oriented in a preferred direction parallel to a main surface of the green sheet in the direction of the drawing direction. The green sheet is then sintered, wherein a multiplicity of first regions arise from the basic material and the organic fibers and/or laminae are reduced to ash such that they form a multiplicity of air-filled columnar second regions in the plate.

In this method, too, by applying a magnetic field during drawing of the slip into a green sheet, it is possible to obtain a greater orientation of the fibers and/or of the laminae along the preferred direction.

In all of the methods described here, a composite material arises which comprises the first and the second wavelength-converting regions. The composite material that results is subsequently cut transversely with respect to the preferred direction into plates having a suitable thickness to produce the final conversion laminae.

It goes without saying that examples which, in this case, are described only in conjunction with the conversion element can likewise be used in conjunction with the semiconductor component and the methods. Furthermore, examples described only in conjunction with the methods can also be used in conjunction with the conversion element and in conjunction with the semiconductor component. Likewise, examples described only in conjunction with the semiconductor component can be embodied in conjunction with the method and the conversion element. Examples explicitly mentioned only in conjunction with one specific method can also be realized in conjunction with the other methods.

Further advantages and developments will become apparent from the examples described below in conjunction with the figures.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with exaggerated size to enable better illustration and/or to afford a better understanding.

The ceramic conversion element 1 in accordance with the example in FIG. 1 comprises a multiplicity of first regions 2 in a vitreous, ceramic or monocrystalline form. The first regions 2 furthermore convert electromagnetic radiation in a first wavelength range into electromagnetic radiation in a second wavelength range different from the first wavelength range.

Furthermore, the ceramic conversion element 1 in accordance with FIG. 1 comprises a multiplicity of second regions 3, which, in this case, are columnar and have a preferred direction 4 forming an angle of at most 45° with a normal 5 to a main surface 6 of the conversion element 1.

Furthermore, the second regions 3 are formed by a resin 7 into which phosphor particles are embedded. The phosphor particles convert electromagnetic radiation in a first wavelength range into electromagnetic radiation in a third wavelength range different from the first and second wavelength ranges.

In this example, the conversion element 1 converts electromagnetic radiation in a first wavelength range that comprises blue light or is formed from blue light. Particularly preferably, the first regions convert blue light in the first wavelength range into yellow light in the second wavelength range. For this purpose, the first regions 2 are preferably formed from a ceramic YAG:Ce material.

The second columnar regions 3 furthermore convert blue light in the first wavelength range into a third wavelength range that comprises red light or is formed from red light. For this purpose, the phosphor particles particularly preferably comprise a doped nitride material or are formed from a doped nitride material. The nitride material is particularly preferably doped with europium.

In the case of the conversion element 1 in FIG. 1, one of the main surfaces 6 is furthermore provided as a radiation exit surface, while the other main surface 8, situated opposite the radiation exit surface, is provided as a radiation entrance surface.

Figure 2:
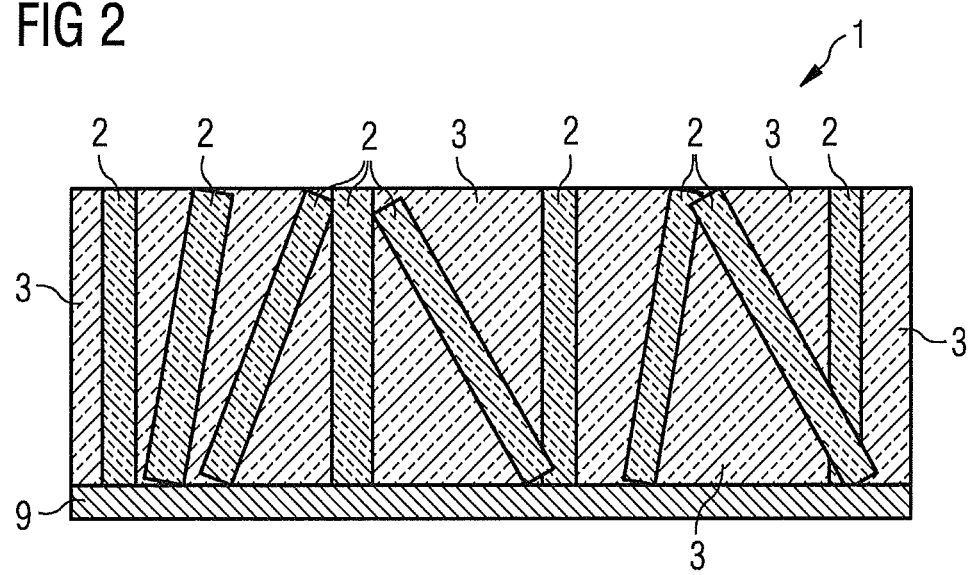

In contrast to the ceramic conversion element 1 in accordance with the example in FIG. 1, the ceramic conversion element 1 in accordance with the example in FIG. 2 comprises a carrier 9. The first regions 2 and the second regions 3 are arranged on the carrier 9, wherein a main surface of the carrier 9 is arranged parallel to the main surface 6 of the conversion element 1. In this case, the first regions 2 and the second regions 3 are arranged in direct contact on the carrier 9.

Furthermore, in contrast to the example in FIG. 1, the first regions 2 are columnar. By way of example, the first regions 2 are formed from monocrystalline or ceramic wavelength-converting fibers. In this case, the second regions 3 are formed from a resin into which wavelength-converting phosphor particles are introduced.

The carrier 9 can be a ceramic carrier plate, for example. The first regions 2 and the second regions 3 are particularly preferably sintered onto such a ceramic carrier plate.

Figure 3:
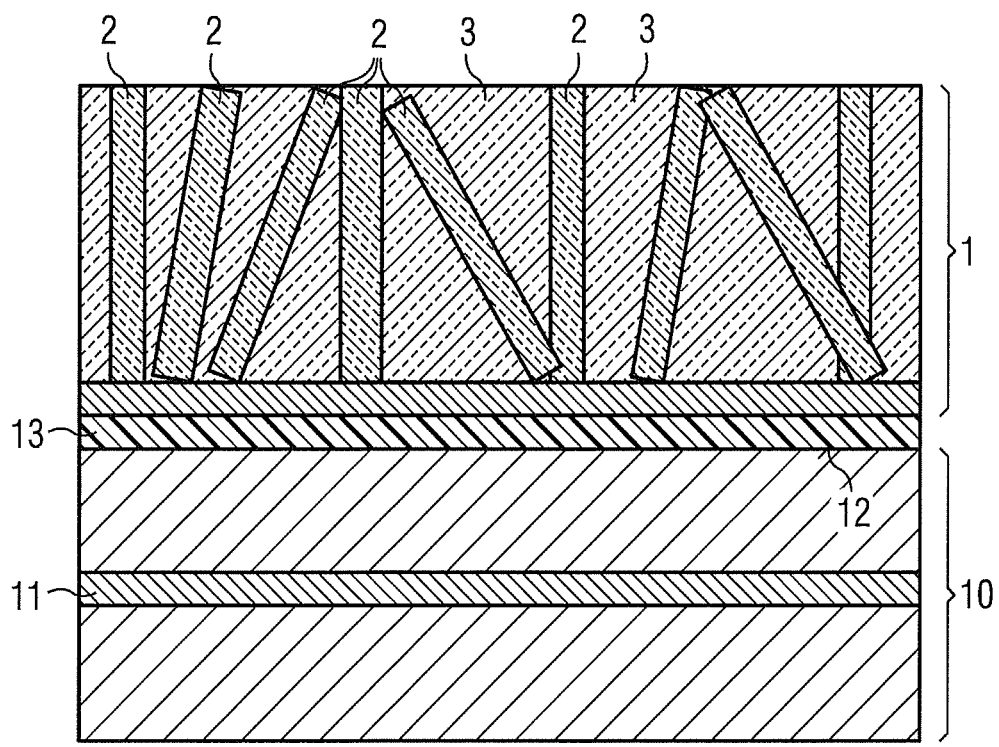
FIGS. 3 and 4 show a schematic sectional illustration of an optoelectronic component in accordance with a respective example.

The optoelectronic component in accordance with the example in FIG. 3 comprises a semiconductor body 10 having an active zone 11 that emits electromagnetic radiation in a first wavelength range during operation. The active zone 11 preferably comprises a pn junction, a double heterostructure, a single quantum well or particularly preferably a multiquantum well structure for generating radiation.

The semiconductor body 10 emits electromagnetic radiation in a first wavelength range from its radiation exit surface 12, the first wavelength range comprising blue light or being formed from blue light. A ceramic conversion element 1 such as has already been described with reference to FIG. 2 is applied to the radiation exit surface 12 of the semiconductor body 10. The ceramic conversion element 1 converts part of the radiation in the first wavelength range emitted by the semiconductor body 10 into radiation in a second wavelength range, different from the first wavelength range, and into a third wavelength range different from the first and second wavelength ranges.

The first regions 2 of the conversion element 1 convert part of the blue radiation of the semiconductor body into yellow light, while the second regions 3 of the conversion element 1 convert part of the blue radiation emitted by the semiconductor body 10 into red light. Part of the blue radiation of the semiconductor body 10 passes through the conversion element 1 without being converted. Therefore, the radiation exit surface of the conversion element emits mixed light composed of blue unconverted radiation of the semiconductor body 10 and yellow light converted by the first regions 2 and red light converted by the second regions 3.

The conversion element 1 is arranged on the radiation exit surface 12 of the semiconductor body 10 by a joining layer 13. The joining layer 13 is formed from a silicone resin.

The mixed radiation emitted by the optoelectronic component in accordance with FIG. 3 preferably has a color locus lying in the warm-white region of the CIE standard chromaticity diagram.

Figure 4:
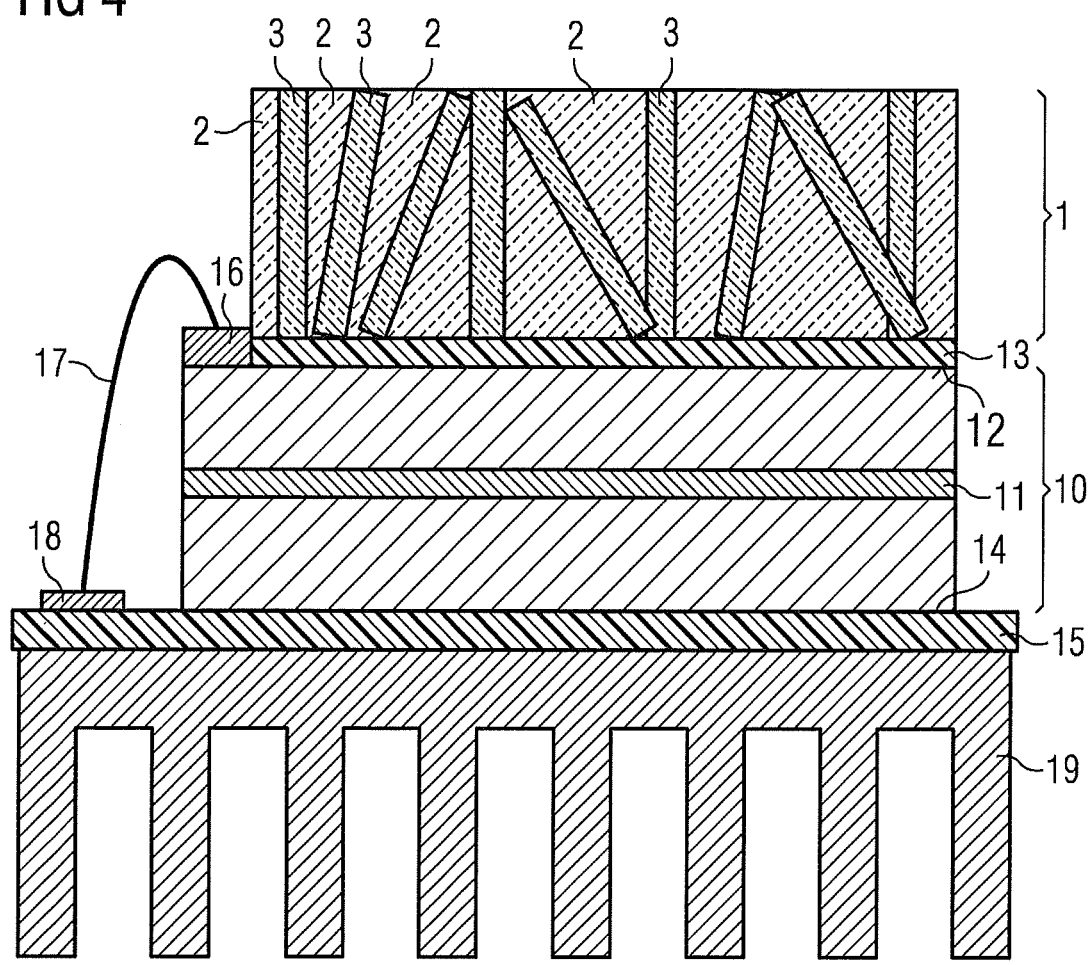

The optoelectronic component in accordance with the example in FIG. 4 comprises a semiconductor body 10 such as has already been described with reference to FIG. 3. A conversion element 1 such as has already been described with reference to FIG. 1 is applied to the radiation exit surface 12 of the semiconductor body 10 by a joining layer 13.

The semiconductor body 10 is furthermore arranged with its rear side 14 situated opposite its radiation exit surface, on a circuit board 15. Laterally with respect to the conversion element 1, a bonding pad 16 is arranged on the semiconductor body 10, the bonding pad electrically conductively connected to a connection location 18 on the circuit board 15 by a bonding wire 17. Furthermore, the optoelectronic component in accordance with FIG. 4 comprises a heat sink 19 on which in turn the circuit board 15 is arranged. The heat sink 19 dissipates heat from the semiconductor body 10 and the conversion element 1 during operation of the optoelectronic component.

Figure 5:
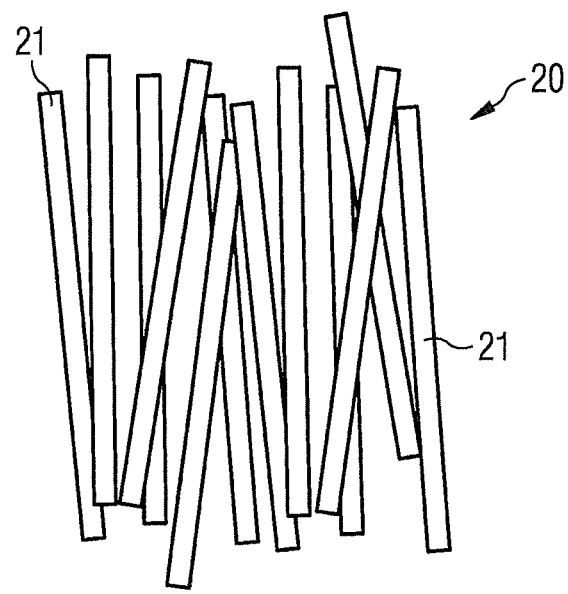
FIGS. 5 and 6 show schematic sectional illustrations on the basis of which a first example of a method of producing a ceramic conversion element is described.
Figure 6:
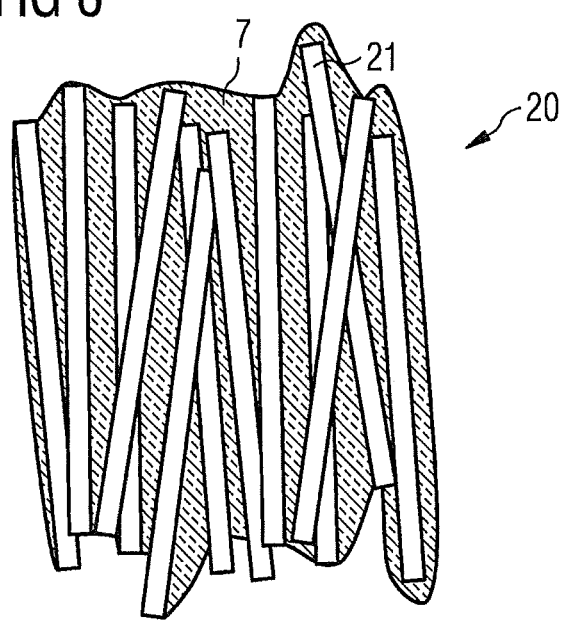

In the method in accordance with the example in FIGS. 5 and 6, a bundle 20 of ceramic or monocrystalline fibers 21 is provided, the fibers converting electromagnetic radiation in a first wavelength range into electromagnetic radiation in a second wavelength range different from the first wavelength range. Particularly preferably, the fibers involved are monocrystalline YAG:Ce fibers 21 that convert radiation in a first wavelength range which comprises blue light or is formed from blue light into a second wavelength range which comprises yellow light or is formed from yellow light. The fiber bundle 20 is illustrated schematically in FIG. 5.

As shown schematically with reference to FIG. 6, for example, in a next step a resin 7 with phosphor particles is introduced between the fibers 21 of the fiber bundle 20. The resin 7 can be introduced between the fibers 21 of the bundle 20 by vacuum or excess pressure, for example.

The phosphor particles convert electromagnetic radiation in the first wavelength range into electromagnetic radiation in a third wavelength range different from the first and second wavelength ranges. In this case, particularly preferably use is made of a phosphor based on a europium-doped nitride material or formed from a europium-doped nitride material and converts radiation in a first wavelength range which comprises blue light into radiation in a third wavelength range which comprises red light or is formed from red light. The resin 7 can be, for example, a silicone resin, an epoxy resin or an acrylic resin.

In a next step, which is not illustrated in this case, the composite comprising fiber bundle 20 and resin 7 is cured, with the result that the fibers 21 form a multiplicity of first regions 2 and the resin forms a multiplicity of second regions 3.

In this method, a fiber plate arises, which is separated transversely with respect to the fibers into corresponding conversion elements (not illustrated).

Figure 7:
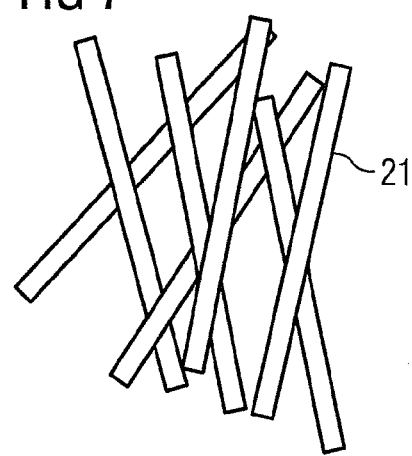
FIGS. 7 to 9 show schematic sectional illustrations on the basis of which a further example of a method of producing a ceramic conversion element is described.
Figure 8:
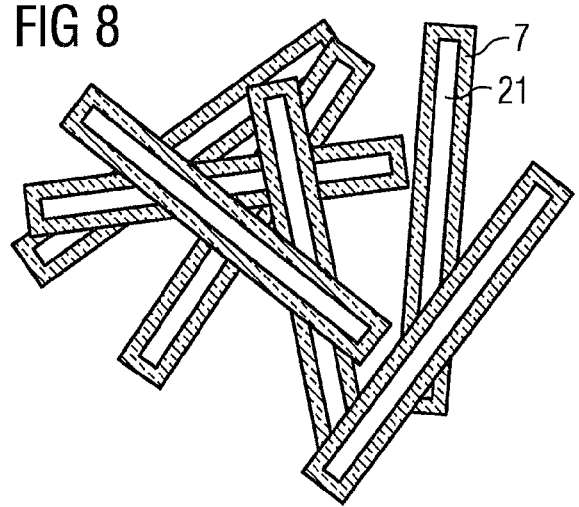
Figure 9:
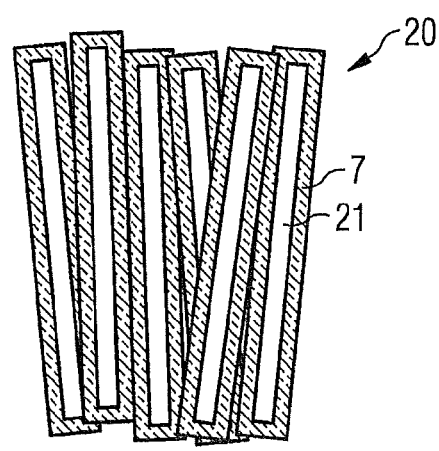

In the method in accordance with the example in FIGS. 7 to 9, ceramic or monocrystalline fibers 21 are provided, the fibers converting electromagnetic radiation in a first wavelength range into electromagnetic radiation in a second wavelength range different from the first wavelength range (FIG. 7). In contrast to the methods in accordance with FIGS. 5 and 6, the fibers 21 are not present in the form of a bundle 20 at the beginning of the method. Rather, the fibers are present in a disordered fashion.

In a next step, the fibers 21 are coated with a resin 7 into which phosphor particles are introduced (FIG. 8). The phosphor particles convert electromagnetic radiation in the first wavelength range into electromagnetic radiation in a third wavelength range different from the first and second wavelength ranges.

After the fibers 21 have been coated with the resin 7, the coated fibers are bundled (FIG. 9).

The bundle 20 of coated fibers 21 is cured, with the result that the fibers 21 form a multiplicity of first regions 2 and the resin 7 forms a multiplicity of second regions 3.

Particularly preferably, the resin 7 is at least partly cured before the process of bundling the fibers 21 to form a fiber bundle 20.

Figure 10:
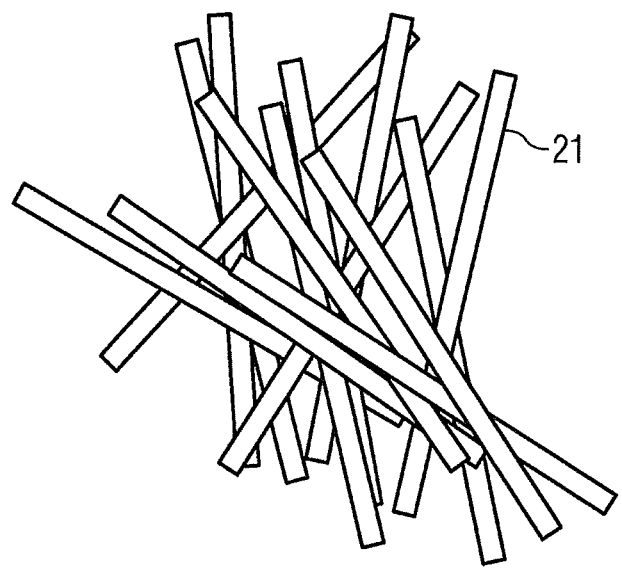
FIGS. 10 to 16 show schematic illustrations on the basis of which a still further example of a method of producing a ceramic conversion element is described.
Figure 11:
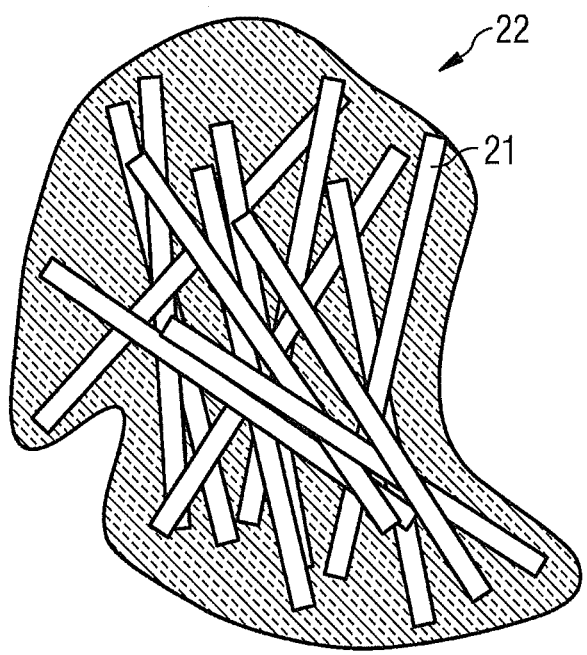
Figure 12:
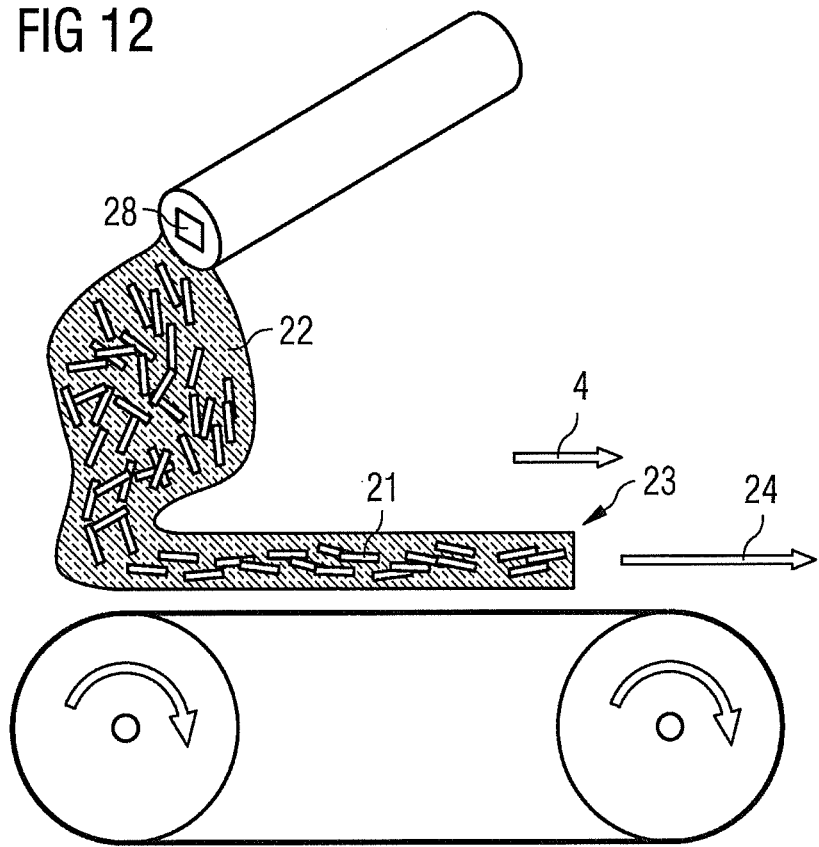
Figure 13:
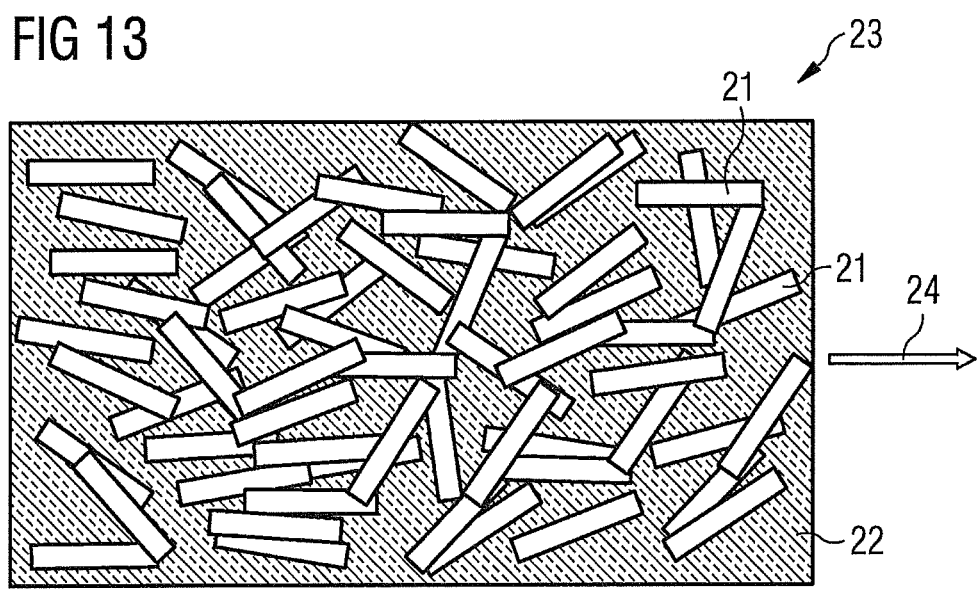
Figure 14:
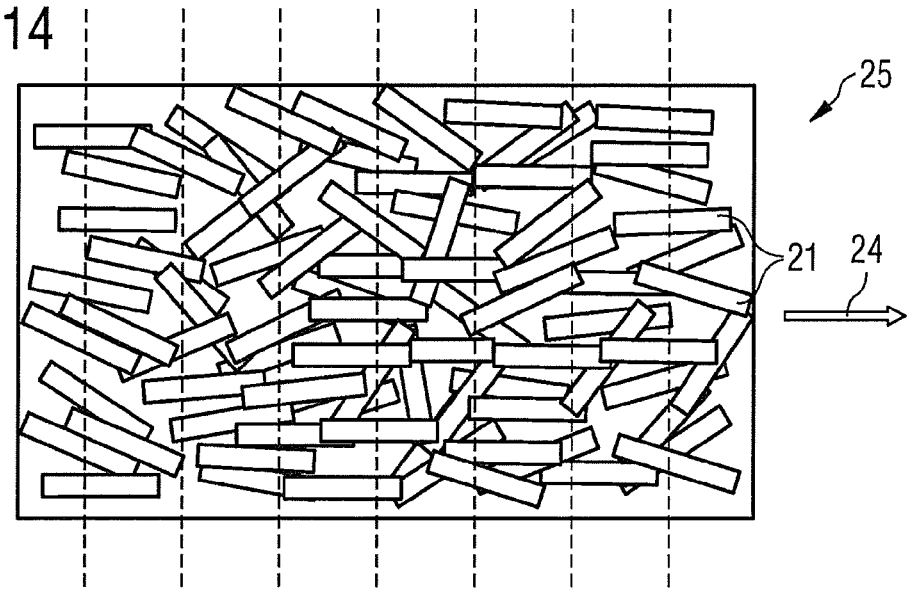

In a method in accordance with the example in FIGS. 10 to 16, ceramic or monocrystalline fibers 21 are provided, the fibers converting electromagnetic radiation in a first wavelength range into radiation in a second wavelength range different from the first wavelength range (FIG. 10). The fibers 21 are processed to form a slip 22 (FIG. 11). Particularly preferably, in this case short fibers 21 are used which are processed in high concentration to form a slip 22.

The slip 22 is drawn into a green sheet 23, wherein the fibers 21 are oriented in a preferred direction 4 parallel to a main surface of the green sheet 23 along the drawing direction 24. Particularly preferably, a slotted nozzle is used for this purpose, and contributes to the orientation of the fibers 21. This is illustrated schematically in the sectional illustration in FIG. 12 and the plan view in FIG. 13.

Orientation of the fibers 21 can advantageously be intensified by a high magnetic field preferably applied during the process of drawing the slip 22 into the green sheet 23.

The green sheet 23 or a green plate formed from a plurality of laminated green sheets 23 is processed further to form a highly porous fiber plate. The fiber plate that arises, as illustrated, for example, in the schematic plan view in FIG. 14, comprises the ceramic or crystalline fibers 21 and air inclusions between the fibers 21.

In this method, the fibers 21 particularly preferably have an average length such that very deep, preferably continuous air-filled cavities arise in the fiber plate 25 that forms.

In a next step, the fiber plate 25 is separated transversely with respect to the drawing direction 24 to produce individual conversion elements 1.

Figure 15:
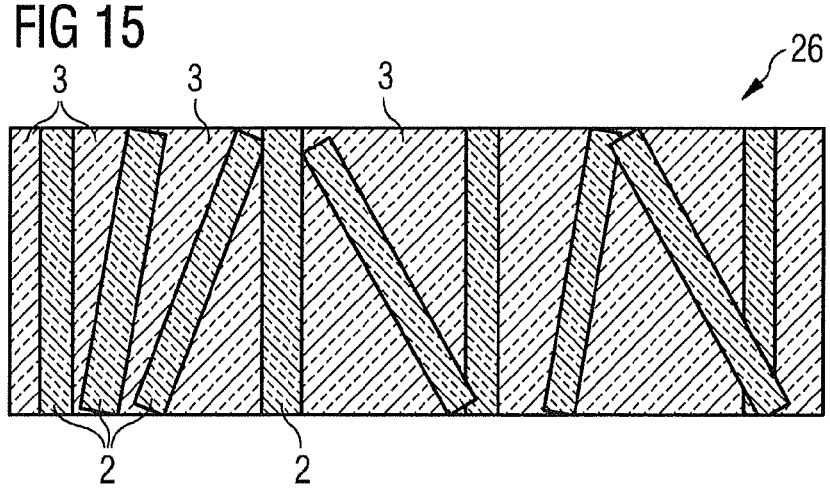

A conversion element 1 that arises is illustrated, for example, in the schematic sectional illustration in FIG. 15. A ceramic or vitreous plate 26 having a multiplicity of air-filled second regions 3 arises as a result of the separation, wherein the material of the plate 26 converts electromagnetic radiation in a first wavelength range into electromagnetic radiation in a second wavelength range different from the first wavelength range. The short fibers 21 form columnar wavelength-converting first regions 2 in the ceramic or vitreous plate 26.

Figure 16:
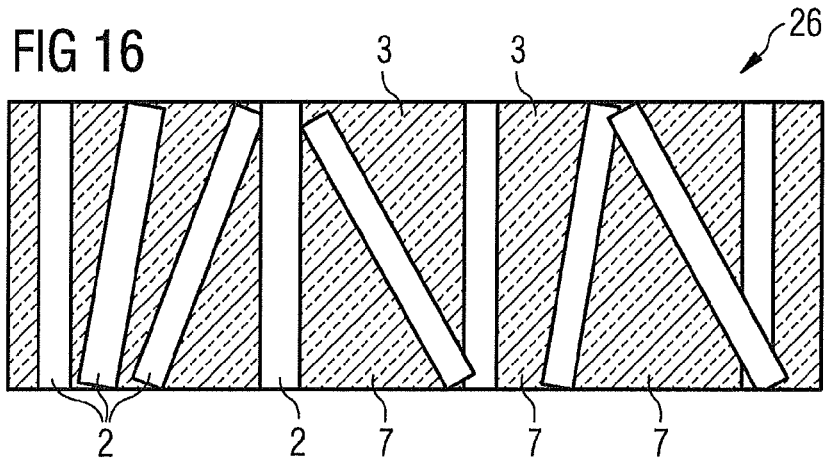

In a further step, a resin 7 into which phosphor particles are introduced is introduced into the air-filled second regions 3 of the plate 26 (FIG. 16). The resin 7 is subsequently cured.

In the method in accordance with the example in FIGS. 17 to 21, a slip 22 is once again produced in a first step (not illustrated). For this purpose, a basic material 27 for the ceramic or vitreous plate 26 is provided, the basic material converting electromagnetic radiation in a first wavelength range into electromagnetic radiation in a second wavelength range different from the first wavelength range. To produce the slip 22, organic fibers 21 and/or laminae are introduced into the basic material.

Figure 17:
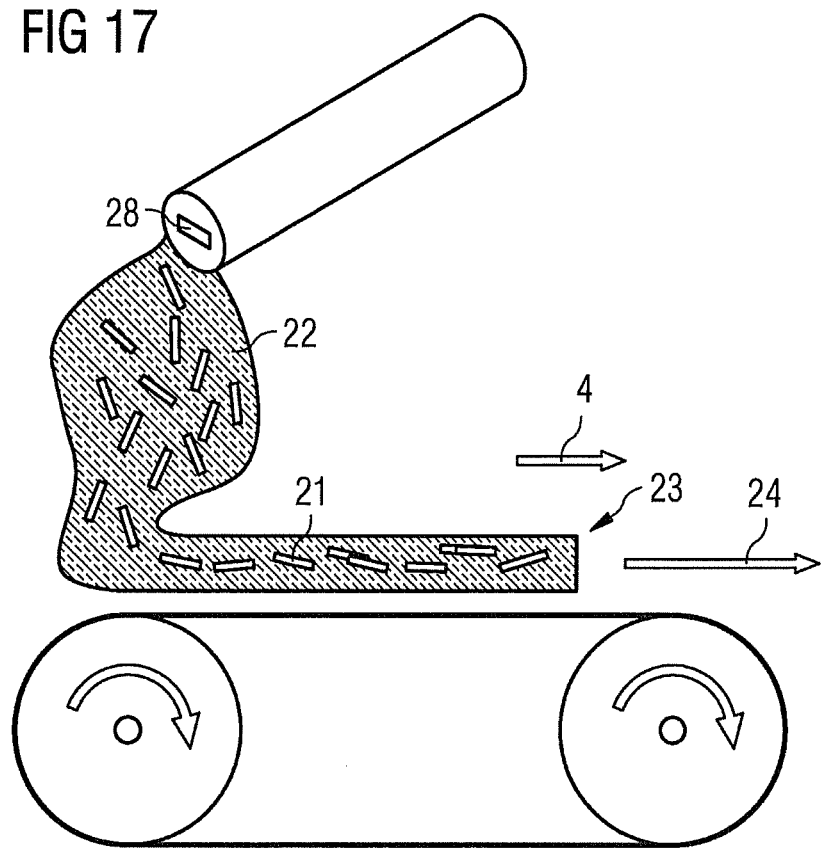
FIGS. 17 to 21 show schematic sectional illustrations on the basis of which a yet further example of a method of producing a ceramic conversion element is described.
Figure 18:
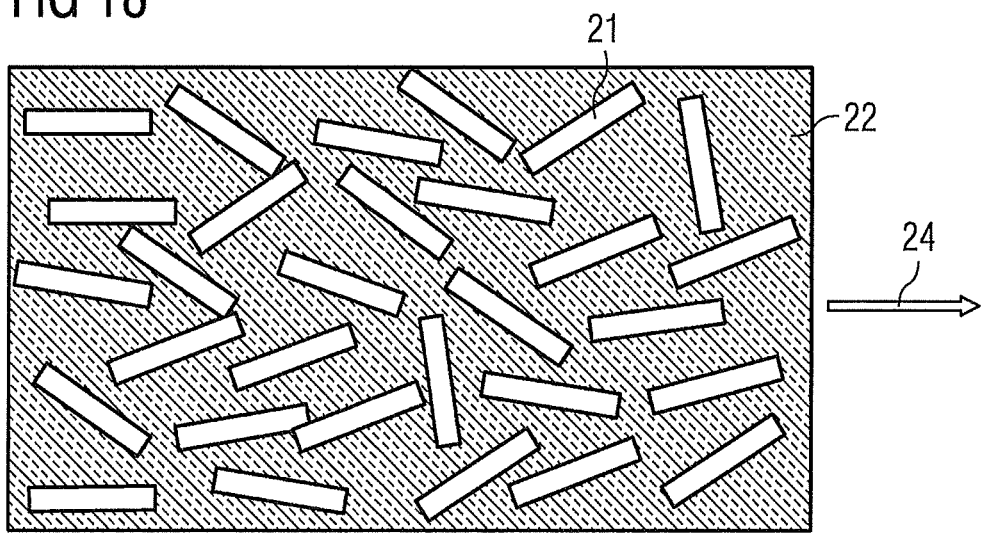

In a next step, the slip 22 is drawn into a green sheet 23, wherein the fibers 21 and/or laminae are oriented in a preferred direction 4 parallel to a main surface of the green sheet 23 in the direction of the drawing direction 24 (FIGS. 17 and 18). In this case, the orientation of the fibers 21 along the preferred direction 4 can once again be intensified by the application of a magnetic field.

Figure 19:
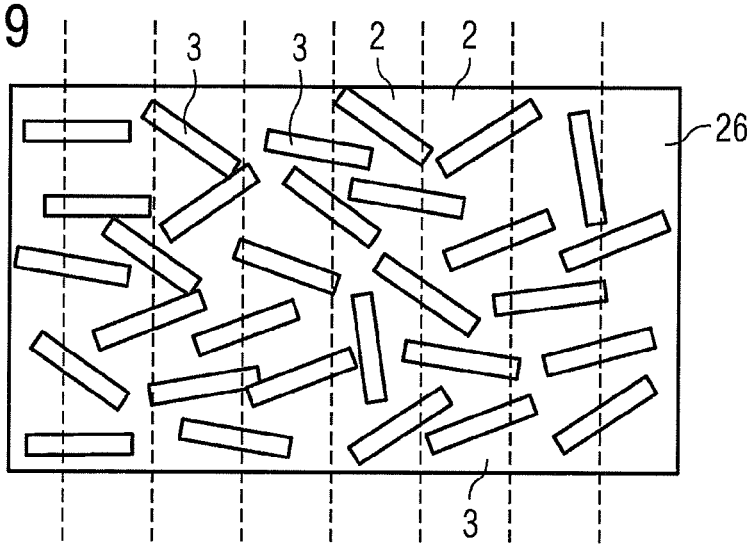
Figure 20:
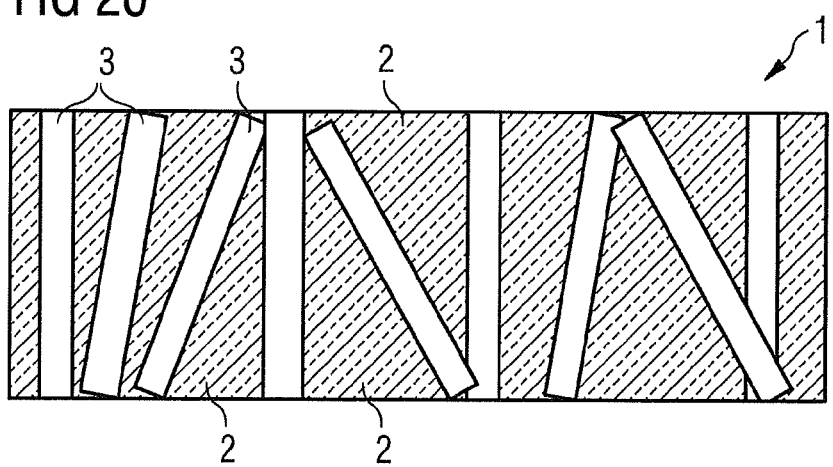
Figure 21:
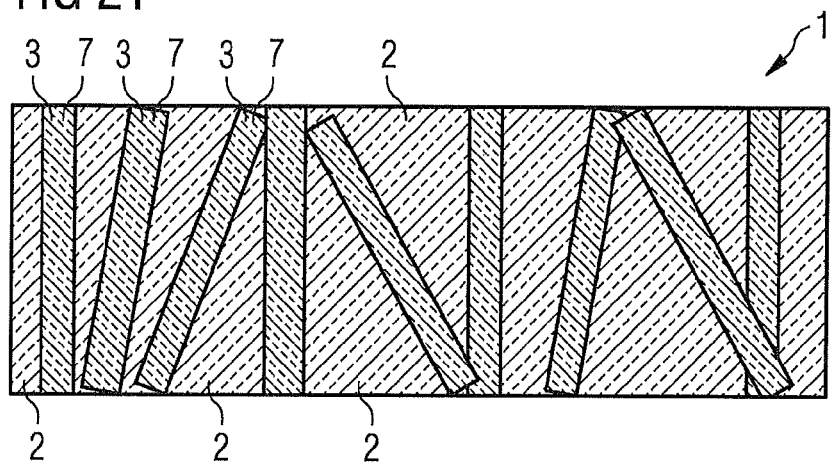

In a next step, the green sheet 23 is sintered, wherein a multiplicity of first ceramic wavelength-converting regions 2 arise from the basic material and the organic fibers 21 and/or laminae are reduced to ash such that a multiplicity of air-filled columnar second regions 3 are formed in the plate 26 (FIG. 19).

In a next step, the plate 26 is separated perpendicularly to the drawing direction 24 to produce conversion elements 1. A conversion element 1 is illustrated, for example, in the schematic sectional illustration in FIG. 20. The conversion element 1 comprises a multiplicity of air-filled columnar second regions 3. A resin 7 with wavelength-converting phosphor particles is introduced into the air-filled columnar regions 3.

Our elements, components and methods are not restricted to the examples by the description on the basis of said examples. Rather, this disclosure encompasses any novel feature and also any combination of features, which in particular includes any combination of features in the appended claims, even if the feature or combination itself is not explicitly specified in the claims or examples.

The invention claimed is:

1. A ceramic conversion element comprising a multiplicity of first regions and a multiplicity of second regions, wherein:
   the first regions are vitreous, ceramic or monocrystalline,
   at least either the first regions or the second regions are columnar and have a preferred direction forming an angle of at most 45° with a normal to a main surface of the conversion element,
   the first regions convert electromagnetic radiation in a first wavelength range into electromagnetic radiation in a second wavelength range different from the first wavelength range,
   the second regions convert electromagnetic radiation in the first wavelength range into electromagnetic radiation in a third wavelength range different from the first and second wavelength ranges, wherein the second regions are formed by a resin into which phosphor particles are embedded.

2. The ceramic conversion element according to claim 1, wherein the first wavelength range comprises blue light, the second wavelength range comprises yellow light and the third wavelength range comprises red light.

3. The ceramic conversion element according to claim 1, further comprising a carrier on which the first regions and the second regions are arranged, wherein a main surface of the carrier is arranged parallel to the main surface of the conversion element.

4. The ceramic conversion element according to claim 3, wherein the carrier is a ceramic or monocrystalline carrier plate.

5. An optoelectronic component comprising a semiconductor body which emits electromagnetic radiation in a first wavelength range from its radiation exit surface during operation, and the ceramic conversion element according to claim 1, which converts at least part of the radiation in the first wavelength range emitted by the semiconductor body into radiation in a second wavelength range different from the first wavelength range, and into a third wavelength range different from the first and second wavelength ranges.

6. The optoelectronic component according to claim 5, wherein the conversion element is arranged with a main surface on the radiation exit surface of the semiconductor body.

7. The optoelectronic component according claim 5, which emits warm-white light.

8. A method of producing a ceramic conversion element comprising:
   providing a bundle of ceramic or monocrystalline fibers that convert electromagnetic radiation in a first wavelength range into electromagnetic radiation in a second wavelength range different from the first wavelength range, introducing a resin with phosphor particles between the fibers of the fiber bundle, wherein the phosphor particles convert electromagnetic radiation in the first wavelength range into electromagnetic radiation in a third wavelength range different from the first and second wavelength ranges, curing the composite comprising fiber bundle and resin such that the fibers form a multiplicity of first regions and the resin forms a multiplicity of second regions.

9. The method according to claim 8, wherein the resin is introduced between the fibers of the bundle by vacuum or excess pressure.

10. A method of producing a ceramic conversion element comprising:

providing ceramic or monocrystalline fibers that convert electromagnetic radiation in a first wavelength range into electromagnetic radiation in a second wavelength range different from the first wavelength range, coating the fibers with a resin into which phosphor particles are introduced, wherein the phosphor particles convert electromagnetic radiation in the first wavelength range into electromagnetic radiation in a third wavelength range, different from the first and second wavelength ranges, bundling the coated fibers to form a fiber bundle, and curing the bundle comprising coated fibers such that the fibers form a multiplicity of first regions and the resin forms a multiplicity of second regions.

11. The method according to claim 10, wherein the resin is partly cured before the process of bundling the fibers.

12. A method of producing a ceramic conversion element comprising:

providing a ceramic or vitreous plate comprising a multiplicity of air-filled second regions, wherein the material of the plate converts electromagnetic radiation in a first wavelength range into electromagnetic radiation in a second wavelength range different from the first wavelength range, said plate is produced by a method comprising the following steps:

providing ceramic or monocrystalline fibers that convert electromagnetic radiation in a first wavelength range into radiation in a second wavelength range different from the first wavelength range, processing the fibers to form a slip, drawing the slip into a green sheet, wherein the fibers are oriented in a preferred direction parallel to a main surface of the green sheet along the drawing direction, processing the green sheet further to form a ceramic or vitreous plate, introducing a resin into which phosphor particles are introduced, said phosphor particles converting radiation in the first wavelength range into radiation in a third wavelength range different from the first and second wavelength ranges, into air-filled second regions of the plate, and curing the resin.

13. The method according to claim 12, wherein the plate is produced by a method comprising:

providing a basic material for the ceramic or vitreous plate, said basic material converting electromagnetic radiation in a first wavelength range into electromagnetic radiation in a second wavelength range different from the first wavelength range, introducing organic fibers and/or laminae into the basic material, thereby producing a slip, drawing the slip into a green sheet, wherein the fibers and/or the laminae are oriented in a preferred direction parallel to a main surface of the green sheet in the direction of the drawing direction, and sintering the green sheet, wherein a multiplicity of first regions arise from the basic material and the organic fibers and/or laminae are reduced to ash such that they form a multiplicity of air-filled columnar second regions in the plate.

* * * * *